(12) United States Patent
Aynvarg et al.

(10) Patent No.: US 6,208,149 B1
(45) Date of Patent: Mar. 27, 2001

(54) METHOD AND APPARATUS FOR MONITORING ELECTRIC INSULATION CONDITIONS IN ENERGIZED ELECTRIC SYSTEMS

(76) Inventors: Arkady Aynvarg, 444 Larkin St., San Francisco, CA (US) 94102; Yuliy Budovsky, 2395 16 Ave., San Francisco, CA (US) 94116

( * ) Notice: Subject to any disclaimer, the term of this patent is extended or adjusted under 35 U.S.C. 154(b) by 0 days.

(21) Appl. No.: 09/219,283

(22) Filed: Dec. 22, 1998

(51) Int. Cl.[7] .................... H01H 31/12; H01H 31/02; G01R 31/14; G01R 31/02
(52) U.S. Cl. .................... 324/551; 324/510; 324/536; 324/541; 324/544
(58) Field of Search ............................ 324/551, 544, 324/541, 510, 539, 536

(56) References Cited

U.S. PATENT DOCUMENTS

| | | | |
|---|---|---|---|
| 4,301,399 | 11/1981 | Miller | 324/541 |
| 4,896,115 | 1/1990 | Gerin | 324/551 |
| 5,032,795 | 7/1991 | Asars et al. | 324/544 |
| 5,117,191 | 5/1992 | Saigo et al. | 324/551 |
| 5,287,062 | 2/1994 | Pellgrin et al. | 324/551 |
| 5,652,521 | * 7/1997 | Meyer | 324/551 |
| 5,712,572 | * 1/1998 | Tamechika | 324/551 |

\* cited by examiner

*Primary Examiner*—Safet Metjahic
*Assistant Examiner*—James C Kerveros
(74) *Attorney, Agent, or Firm*—I. Zborovsky

(57) ABSTRACT

A method and an apparatus for monitoring conditions of electric insulation in a live or energized electric system. The invention takes into account the fact that, when the insulation resistance of an electric system is measured under real live conditions, the electric insulation works under voltages and current-leakage conditions which different from those measured in so-called "cold" state. The invention is based on two voltage measurements in one of which the operating conditions of the electric insulation are artificially changed for a known value. Insulation parameters are then calculated by a set of formulas using the results of the two measurements.

47 Claims, 4 Drawing Sheets

METHOD AND APPARATUS FOR MONITORING ELECTRIC INSULATION CONDITIONS IN ENERGIZED ELECTRIC SYSTEMS

FIELD OF THE INVENTION

The present invention relates to electric system control, in particular, to a method and an apparatus for monitoring electric insulation conditions in energized electric systems.

BACKGROUND OF THE INVENTION AND DESCRIPTION OF THE PRIOR ART

It is well known that impaired condition of the electric insulation with leakage of current may lead not only to improper operation of the entire electric system but to more serious consequences such as injury and death of people. An example of this is the crash of Boeing 747 off Long Island in July, 1996. Another crash occurred in 1990 with Boeing 737 on the tarmac in Manila. Investigation showed that in both cases a possible reason of the crash was damaged wire insulation which could allow a surge of a high voltage into the fuel tank (see information from Internet: "FAA Targets Wiring of 737s. Action Stems from Flight 800 Explosion" by Sylvia Adcock, Staff Writer).

Therefore constant monitoring of conditions of electric insulation in electric systems is an extremely important issue.

Methods for measuring electric insulation resistance in a "cold" (non-energized) state of electric systems are known. Such methods possess a plurality of disadvantages the main of which are the following: 1) in order to control electric insulation resistance, the electric system or its portion which is subject to control must be de-energized.; 2) inaccuracy in evaluating the results of the aforementioned control; this inaccuracy resulting from the fact that the insulation resistance characteristics are measured in a non-operative state of the electric system; 3) inability of urgent measures for preventing accelerated wear and damage of the insulation.

In view of the above, obtaining reliable data about the current condition of the electric insulation in the entire electric system or in its part under live or energized conditions is an extremely important issue (see, e.g.,: Meetings of SIGRE WG 15/33-08 "Insulation Monitoring and Life Estimation", Aug. 26–28, 1996, Paris; Sep. 5, 1997, Lake George, N.J.).

Attempts have been made to develop methods and apparatus for obtaining information on the state of the electric insulation under live conditions. For example, U.S. Pat. No. 4,301,399 issued in 1981 to H. Miller describes an electric cable having means for monitoring conditions of the electric insulation between various layers of the cable. This is achieved by interposing an electricaly conductive integrity monitoring layer between the two insulating layers so that a first one of the insulating layers is disposed between the conductive members and the conductive layer, and a second one of the insulating layers is disposed between the conductive layer and the environment surrounding the device. The system monitors the impedance of the first layer between the conductive members and the conductive layer, as well as the impedance of the second layer between the conductive layer and the surrounding environment.

A disadvantage of the system and method of U.S. Pat. No. 4,301,399 is that the cable design must incorporate additional elements for monitoring conditions of cable insulation. Another disadvantage is that the method and system of U.S. Pat. No. 4,301,399 is applicable only to electric cables and is not applicable to other electric systems and devices such as electric motors or multiple-component electric systems.

U.S. Pat. No. 5,287,062 issued in 1994 to C. Pellgrin et al. discloses a device for monitoring direct current (DC) power supply systems. In this device, an alternative current (AC) signal is "injected" into a DC electrical network for performing insulation measurement in a processing unit. The AC signal is measured in a mixed bridge having a first resistive dividing bridge connected in parallel with a second capacitive dividing bridge between the line and the ground. The intermediate output points of the first and second bridges are joined together and connected to an input of the processing unit. The impedance and the dividing ratio of the two bridges cause the DC voltage measured at said input to be low in relation to the value of the AC voltage measured at the output of said mixed bridge.

A disadvantage of the devices of the type described in U.S. Pat. No. 5,287,062 is that they are complicated in structure because they require an additional power source of a predetermined frequency. Furthermore, these devices are not applicable to AC systems or DC systems which do not allow the presence of an AC signal.

U.S. Pat. No. 5,117,191 issued in 1992 to A. Saigo, et al. describes an apparatus for monitoring degradation of insulation in electrical installations. In addition to measuring units, this apparatus contains phase comparison units, phase detection units, a pulse forming circuit, a timing setting circuit, etc. As a result, the monitoring system is very complicated and therefore expensive to manufacture and unreliable in operation.

U.S. Pat. No. 4,896,115 issued in 1990 to M. Gerin describes an electrical network insulation monitoring and measuring device. This device is also complicated in structure because it contains sources of different frequencies (10 Hz and 1 kHz) as well as several converters for processing the signals of different frequencies.

U.S. Pat. No. 5,032,795 issued in 1991 to J. Asars, et al. employs an ion source that generates an ion cloud and causes this cloud to displace along the airplane cable. The device also utilizes signals of different frequencies for detecting insulation damages. It possesses the same disadvantages as the earlier mentioned devices and systems, i.e., it is complicated in structure and has a limited application.

OBJECTS OF THE INVENTION

It is an object of the invention to provide an apparatus and method for monitoring insulation resistance conditions in energized electric systems which do not need de-energization of the electric system for its control or monitoring.

Another object is to provide the aforementioned apparatus and method that ensure accuracy in evaluating the results of the aforementioned control and monitoring.

Further object is to provide a system and a method which exclude modernization or redesigning of the system to be controlled for incorporating measuring and monitoring elements.

Still another object is to provide the apparatus and method suitable for controlling insulation in multiple-component electric systems.

Another object is to provide an insulation monitoring system of the aforementioned type which is simple in structure, inexpensive to manufacture, reliable in operation, and simple to control.

SUMMARY OF THE INVENTION

A method and an apparatus for monitoring conditions of electric insulation in a live or energized electric system. The invention takes into account the fact that, when the insulation resistance of an electric system is measured under real live conditions, the electric insulation works under voltages and current-leakage conditions which different from those measured in so-called "cold" state. The invention is based on two voltage measurements in one of which the operating conditions of the electric insulation are artificially changed for a known value. Insulation parameters are then calculated by a set of formulas using the results of the two measurements.

DETAILED DESCRIPTION OF THE PREFERRED EMBODIMENT

Figure 1:
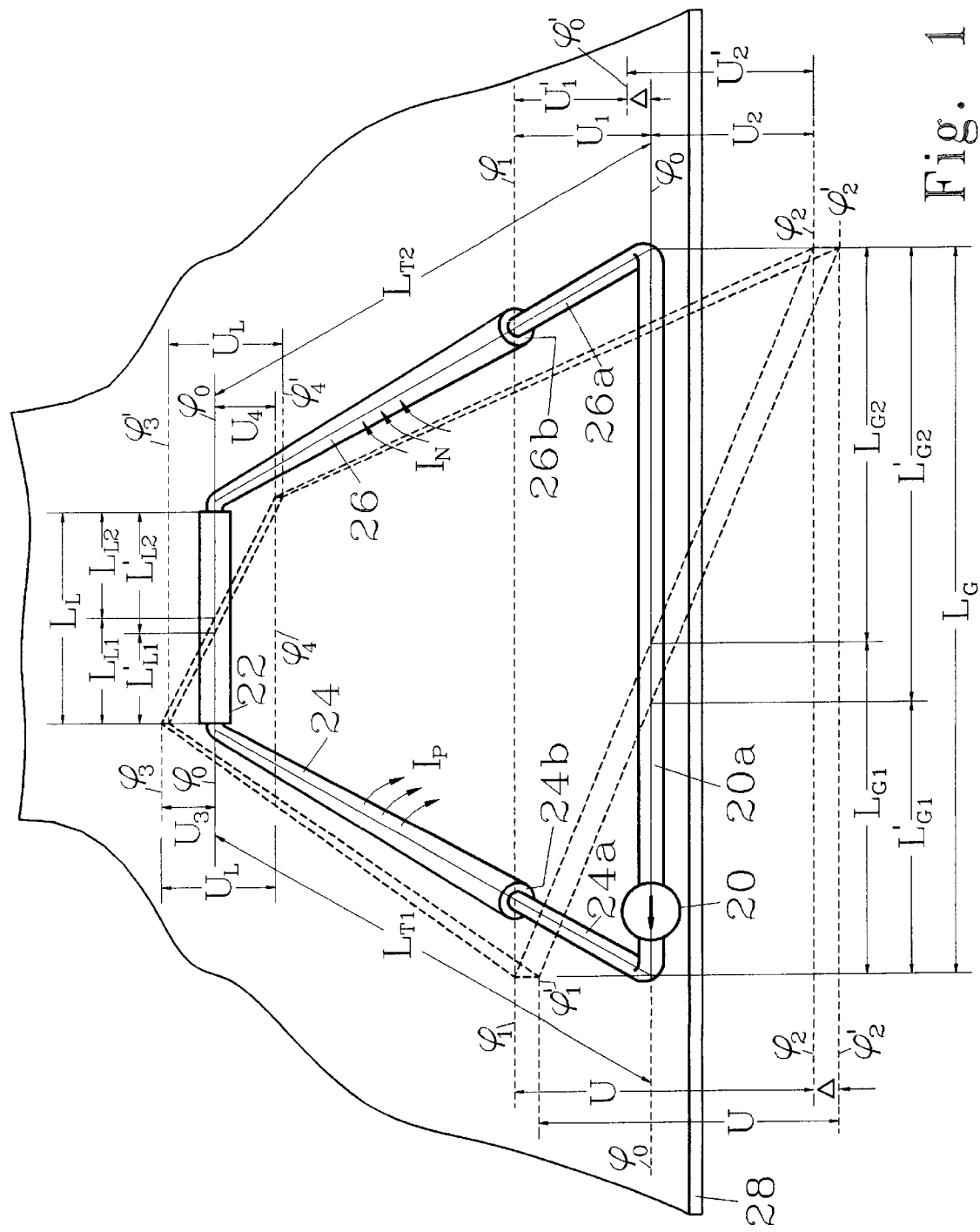
FIG. 1 is a three-dimensional diagram of a typical simple electric system which requires monitoring of the insulation condition in energized or hot-line state.

FIG. 1 is a three-dimensional diagram of a typical simple electric system which requires monitoring of the insulation condition in energized or hot-line state. Such a system is shown in FIG. 1 as a closed electric circuit containing a generator 20 with a winding 20a (which is conventionally shown as a single wire), a load 22, and insulated electric wires 24 and 26 therebetween. Each wire consists of a conductor 24a and 26a and an electric insulation layer 24b and 26b, respectively.

In the context of the present invention, the term "wire" means a combination of an electric conductor of any shape with an electrical insulation. The conductor not necessarily has a round cross section and may have a square or rectangular cross section, etc.

Wire 24 connects the output of generator 20 to an input of load 22, and wire 26 connects the output of load 22 to an input of generator 20. All electrical components of the system, i.e., generator 20, load 22, and insulated wires 24 and 26 are supported by an electrically conductive base 28. This base may comprise a housing, body, floor, or deck. For example, base 28 may be a fuselage of a plane, a hull or a deck of a ship, a board for mounting electrical components, a magnetic part of an electric machine or of a transformer, a metal conduit, etc.

In FIG. 1, a potential diagram is superimposed on the image of the electric system with potentials plotted on vertical lines.

At the ends of its winding 20a, generator 20 generates a potential difference $\phi_1-\phi_2=U$, where $\phi_1$ is a higher potential, $\phi_2$ is a lower potential, and U is a voltage at the generator output which is equal to the electromotive force of the generator minus the voltage drop on generator winding 20a. Hereinafter the potential difference U will be referred to as "system voltage". The potential difference $U_L$ on load 22 may be expressed as $U_L=\phi_3-\phi_4$, where potential $\phi_3$ is $\phi_1$ minus a potential drop on wire 24, and potential $\phi_4$ is $\phi_2$ plus a potential drop on wire 26. Within generator 20 the potential increases from $\phi_2$ to $\phi_1$ (see an inclined line between levels of $\phi_2$ and $\phi_1$ in the potential distribution diagram in FIG. 1), and within load 22 the potential decreases from $\phi_3$ to $\phi_4$. (see line between levels $\phi_3$ and $\phi_4$ on the same diagram).

When the electric system is energized, the electric field causes leakage currents which flow from the higher potential portions of the electric system via the electric insulation and conductive base 28 to the lower potential portions. As a result of the leakage currents, conductive base 28 acquires a potential $\phi_0$ which exists between the highest potential $\phi_1$ and the lowest potential $\phi_2$.

Thus, there are points within generator winding 20a and within load 22 where potentials are equal to $\phi_0$. This condition is illustrated in FIG. 1 by dividing the full length $L_G$ of generator winding 20a into two sections, i.e., a section $L_{G1}$ with a potential higher than $\phi_0$ and a section $L_{G2}$ with a potential lower than $\phi_0$. Similarly, the full length $L_L$ of load 20 may be divided into two sections, i.e., a section $L_{L1}$ with a potential higher than $\phi_0$ and a section $L_{L2}$ with a potential lower than $\phi_0$. Wire 24, the length of which is shown as $L_{T1}$, has a potential slightly decreasing from generator 20 to load 22, and wire 26 the length of which is shown as $L_{T2}$, has a potential slightly decreasing from load 22 to generator 20.

In FIG. 1, lengths of the system portions are shown by solid dimensional lines parallel to the directions of the appropriate portions, whereas voltages are shown by vertical dimensional lines. Potential levels are shown by broken lines.

Leakage currents flow into conductive base 28 from all parts of the system having potentials higher than $\phi_0$. Part of leakage currents having this direction of flow is shown in FIG. 1 by arrows $I_P$. Similarly, leakage currents flows from conductive base 28 into all parts of the system having potentials lower than $\phi_0$. Part of leakage currents having this direction of flow is shown in FIG. 1 by arrows $I_N$. When the electric system operates in a steady state (not in a transient period), conductive body 28 does not accumulate a charge, so that the sum of all leakage currents $I_P$ from portions or wires with potentials higher than $\phi_0$ should return as the sum of currents $I_N$ to portions or wires with potentials lower than $\phi_0$.

For any leakage current conditions, the aforementioned balance of the leakage currents is maintained due to an appropriate mutual relationship between the system potentials and $\phi_0$ of conductive base 28. When the leakage current conditions vary, potential $\phi_0$ may be considered as constant, and potentials $\phi_1$ and $\phi_2$ may be considered as variables and dependable on leakage currents between all the wires and conductive base 28.

An example illustrating relationships between system potentials $\phi_1$, $\phi_2$ and conductive-base potential $\phi_0$ is shown in FIG. 1 for certain current leakage conditions, i.e., when $\phi_0$ is closer to $\phi_2$ than to $\phi_1$. Imagine now that the current leakage conditions have changed so that potential $\phi_1$ decreased by $\Delta$ and became equal to $\phi'_1$ and potential $\phi_2$ decreased by the same $\Delta$ and became equal to $\phi'_2$ (FIG. 1). As a result, the potential difference ($\phi'_1-\phi'_2$) remain the same U (see the left side of the diagram on FIG. 1). Now potential $\phi_0$ became closer to $\phi'_1$ than to $\phi'_2$. Similarly, potentials $\phi_3$ and $\phi_4$ decreased and became equal to $\phi'_3$ and $\phi'_4$, so that their difference $U_L$ remained the same.

Under this condition, the total length $L_G$ will be divided into sections $L'_{G1}$ and $L'_{G2}$, and the total length $L_L$ will be divided into sections $L'_{L1}$ and $L'_{L2}$ which are different from $L_{G1}$, $L_{G2}$, and $L_{L1}$, $L_{L2}$, respectively.

Similarly, potentials $\phi_1$ and $\phi_2$ may be considered constant, but conductive base potential $\phi_0$ may be considered variable depending on the leakage current. On the right side of FIG. 1 this condition is illustrated by a new conductive-base potential $\phi'_0$, which is higher than $\phi_0$ by $\Delta$. Thus, the differences between ($\phi_1-\phi'_0$) and ($\phi'_0-\phi_2$) are the same as ($\phi'_1-\phi_0$) and ($\phi_0-\phi'_2$), respectively.

A manner in which absolute values of the potential are changed (i.e., by fixing the potentials $\phi_1$, $\phi_2$ and varying $\phi_0$, or by fixing $\phi_0$ and varying $\phi_1$, $\phi_2$) is not essential for the method of the invention. This is because the method of the invention is based only on the detectable potential differences which are taken into account for calculations.

Let us designate detectable potential difference between $\phi_1$ and $\phi_0$, i.e., between one terminal of generator 20 and conductive base 28, as voltage $U_1$ (on the right side of FIG. 1), i.e., a $U_1=\phi_1-\phi_0$. Similarly, voltage $U_2$ designates detectable potential difference between conductive base 28 and the other terminal of generator 20, i.e., difference between $\phi_0$ and $\phi_2$, as $U_2=\phi_0-\phi_2$, so that $U_1+U_2=\phi_1-\phi_2=U=\text{Const}$.

Let us designate potential difference between $\phi_3$ and $\phi_0$, i.e., between one terminal of load 22 and conductive body 28, as voltage $U_3$ (FIG. 1), i.e., $U_3=\phi_3-\phi_0$. Similarly, voltage $U_4$ designates difference between $\phi_0$ and $\phi_4$, i.e., between conductive body 28 and the other terminal of load 22, as $U_4=\phi_0-\phi_4$, so that $U_3+U_4=\phi_3-\phi_4=U_L$, where $U_L$ is a load voltage.

By measuring values of voltages $U_1$ and $U_3$ with the use of a voltage measuring instrument, e.g., by voltmeters, one can determine the following ratios:

$$L_{G1}/L_G=U_1/U;\ L_{G2}/L_G=U_2/U=(U-U_1)/U;$$

$$L_{L1}/L_L=U_3/U_L;\ L_{L2}/L=U_4/U_L=(U_L-U_3)/U_L.$$

Figure 2:
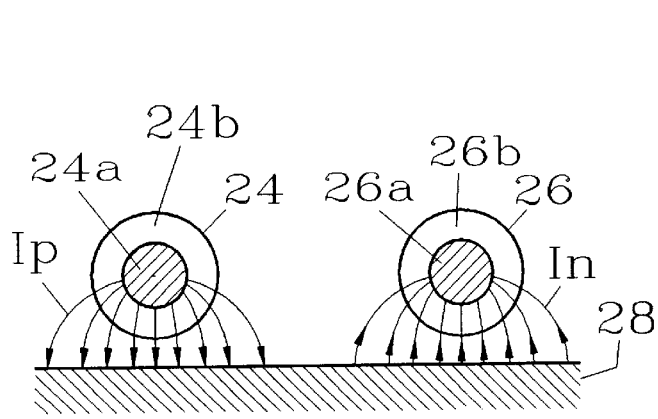
FIG. 2 is sectional view of two wires of the electrical system of FIG. 1 operating under conditions of outflow and inflow of the leakage currents.

For any cross section of wires 24 and 26 (FIG. 1) the leakage currents can be determined from the electric field picture. For wires having identical location with respect to conductive base 28, the electric field picture will correspond to FIG. 2. This figure is a sectional view of two wires 24 and 26 of FIG. 1. In this picture, lines $I_P$ show outflow leakage currents from wire 24 to conductive body 28, and lines $I_N$ show inflow leakage currents from the conductive body 28 to wire 26.

Figure 3:
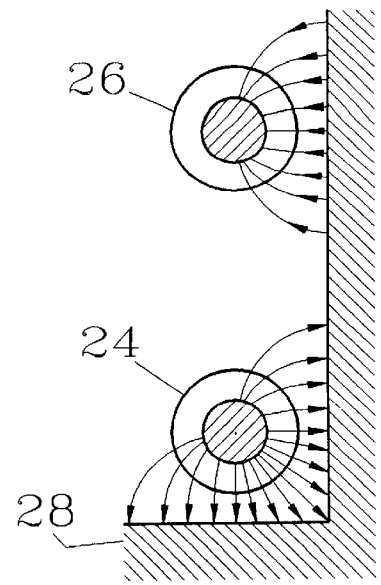
FIG. 3 is a view similar to FIG. 2 for different current leakage conditions on both wires.

However, wires 24 and 26 may have different locations with respect to conductive body 28. An example of such locations is shown in FIG. 3 where the currents leaking from wire 24 have a larger surface of contact with conductive body 28 than the leakage currents returning from conductive body 28 to wire 26. This results in the fact that the positions of points in generator winding 20a and load 22, where potentials are equal to $\phi_0$, are shifted so that the resulting balance of leakage currents which flow into and out of conductive body remains constant.

For any part of the electric system having linear change of potential between the ends of this part, leakage currents which flows into and out from conductive body 28 can be calculated by formulae well known from the electric field theory. In other words, the following parameters may be calculated: $I_{G1}$—resulting leakage current for part $L_{G1}$ of the generator circuit which has a potential higher than $\phi_0$; $I_{T1}$—resulting leakage current for wire 24 having a potential higher than $\phi_0$ and a length $L_{T1}$; $I_{L1}$—resulting leakage current for part $L_{L1}$ of the load circuit which has a potential higher than $\phi_0$; $I_{L2}$—resulting leakage current for part $L_{L2}$ of the load circuit which has a potential lower than $\phi_0$; $I_{T2}$—resulting leakage current for wire 26 having a potential lower than $\phi_0$ and a length $L_{T2}$; and $I_{G2}$—resulting leakage current for part $L_{G2}$ of the generator circuit which has a potential lower than $\phi_0$.

Since in all aforementioned parts and elements of the electric system the potentials change linearly, the aforementioned calculated resulting leakage currents will depend (apart from mutual positions of the wires and the conductive body and dielectric properties of the insulation) only on the following two characteristics: the length of the corresponding part and potentials on its ends. What is meant here under the term of "potentials on its ends" are voltages across the conductive body and the ends of the corresponding part of the electric system. More specifically, for generator 20 these will be voltages $U_1$, $U_2$, for wire 24 these will be voltages $U_1$, $U_3$, for load 22 these will be voltages $U_3$, $U_4$, for wire 26 these will be voltages $U_2$, $U_4$.

In other words, formulae for calculation of $I_{G1}$ and $I_{G2}$ take into account voltages $U_1$, $U_2$, formula for calculation of $I_{T1}$ takes into account voltages $U_1$, $U_3$ at the ends of wire 24, formula for calculation of $I_{T2}$ takes into account voltages $U_2$, $U_4$ at the ends of wire 26, and formulae for calculation of $I_{L1}$, and $I_{L2}$ take into account voltages $U_3$, $U_4$. Since all these voltages between the ends of the parts of the electric system and conductive base 28 may be measured by a voltmeter, and since voltages $U_3$, $U_4$ can be expressed as parts of voltages $U_1$, $U_2$ respectively, all leakage currents from those parts of the electric system, which have a potential higher than $\phi_0$, may be represented as voltage $U_1$ multiplied by leakage conductances G of corresponding parts of the electric system. Similarly, all leakage currents to those parts of the electric system, which have a potential lower than $\phi_0$, may be represented as voltage $U_2$ multiplied by leakage conductances G of corresponding parts of the electric system. The above statement can be expressed by the following formulae:

$$I_{G1}=U_1 \cdot G_{G1};\ I_{T1}=U_1 \cdot G_{T1};\ I_{L1}=U_1 \cdot G_{L1};$$

$$I_{G2}=U_2 \cdot G_{G2};\ I_{T2}=U_2 \cdot G_{T2};\ I_{L2}=U_2 \cdot G_{L2}.$$

The current leakage balance can be expressed as follows:

$$I_{G1}+I_{T1}+I_{L1}=I_{G2}+I_{T2}+I_{L2}.$$

The following expression can be derived from the above:

$$U_1(G_{G1}+G_{T1}+G_{L1})=U_2(G_{G2}+G_{T2}+G_{L2}).$$

By designating the resulting leakage conductance of the parts with potentials higher than $\phi_0$ as $G_1$, which is equal to ($G_{G1}+G_{T1}+G_{L1}$), and by designating the resulting leakage conductance of the parts with potentials lower than $\phi_0$ as $G_2$, which is equal to ($G_{G2}+G_{T2}+G_{L2}$), one can obtain the following basic expression (1):

$$U_1/U_2 = G_2/G_1 \qquad (1).$$

Figure 4A:
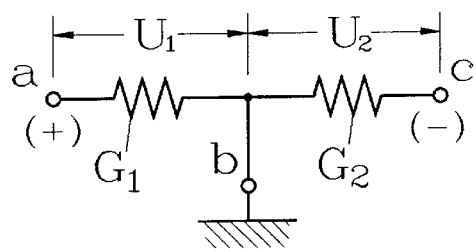
FIG. 4A is an electrical model simulating total current leakage conditions in the system of FIG. 1 for the case of direct current.

An equivalent circuit of the entire leakage current system which satisfies the above equation is shown in FIG. 4A, which shows an electrical model simulating total current leakage conditions in the system of FIG. 1, where points "a" and "c" are higher-potential and lower-potential output terminals of generator 20 respectively, and "b" is a conventional terminal of conductive body 28. It is understood that the model of FIG. 4A relates to the case of a direct current system. The remaining designations correspond to those defined above. It is assumed that the electrical conductivity of conductive body 28 is high enough to consider its potential the same over its entire surface.

Initial conductances $G_1$ and $G_2$ calculated in the stage of design may vary during operation of the system under the effect of such factors as wear and aging of the electrical insulation, humidity and temperature of the environment, etc. It is a specific purpose of the present invention to monitor the conditions of the electric insulation under real operating conditions of an electric system.

Let us designate real leakage conductances which occur under actual operation conditions as "g", in contrast to theoretically calculated conductances G. In other words, resulting real leakage conductances $g_1$ and $g_2$ of both parts may be expressed as follows:

$$g_1 = g_{G1} + g_{T1} + g_{L1};$$

$$g_2 = g_{G2} + g_{T2} + g_{L2}.$$

The method of the invention is based on two measurements of both voltages $U_1$ and $U_2$ under real operating conditions. One such measurement is performed with a controllable variation in conductance $g_1$ or $g_2$.

Let us assume, for example, that only leakage conductances $g_{T1}$ and $g_{T2}$ of wires 24 and 26 are suspected to cause an excessive current leakage, e.g., because of the aged wiring. The remaining conductances are assumed equal to calculated values, i.e., $g_G = G_G$ and $g_L = G_L$.

First measurement determines $U_1$ and $U_2$ for unchanged the leakage conductances of wires 24 and 26. As a result of the first measurement, the following equation is obtained:

$$U_2/U_1 = (G_{G1}+G_{L1}+g_{T1})\ (G_{G2}+G_{L2}+g_{T2}) \qquad (2a)$$

Figures 5A, 5B:
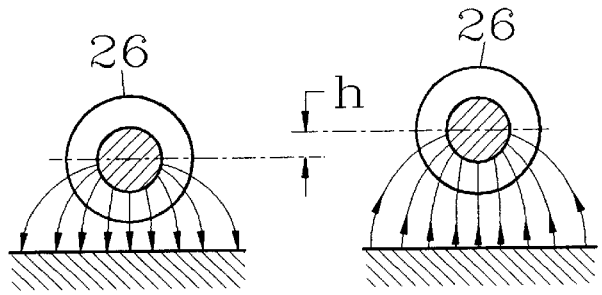
FIG. 5A is a sectional view that shows the initial position of one of the wires.
FIG. 5B is a sectional view that shows the raised position of the wire of FIG. 5A.

The second measurement is carried out with a leakage conductance changed for a known value. For example, for reducing leakage conductance $g_{T2}$ of wire 26, a given part of wire 26, e.g., ⅕ of its length, can be raised above conductive body 28 for a predetermined height "h", as shown in FIGS. 5A and 5B, where FIG. 5A shows the initial position of the wire and FIG. 5B shows a raised position of the same wire. Wire 24 remains in the initial position. It can be assumed that with this change, the resulting leakage conductance $G^0_{T2}$ of the raised part of wire 26 will not significantly differ from the initially calculated value.

The second measurement, which is a measurement with the part of wire 26 raised, will show voltages $U'_1$ and $U'_2$, which determine the following relationship:

$$U'_2/U'_1 = (G_{G1}+G_{L1}+g_{T1})/(G_{G2}+G_{L2}+G^0_{T2}+0.8\ g_{T2}) \qquad (2b).$$

By substituting known values of $G_G$, $G_L$, $G^0_{T2}$ into equations (2a) and (2b), one can obtain the desired values of $g_{T1}$ and $g_{T2}$.

Figure 6:
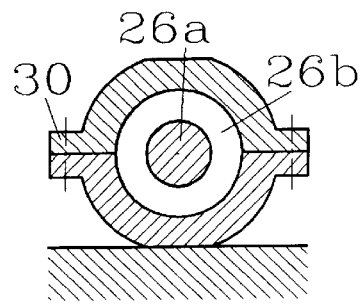
FIG. 6 is sectional view of an insulated wire under conditions of artificially increased current leakage.

If necessary, the leakage conductance may be increased rather than reduced, e.g., if the wire cannot be physically raised. This can be achieved by embracing a portion of a wire with a conductive clamp 30, as shown in FIG. 6. Leakage conductance $G^0_{T2}$ of the wire portion which is embraced by clamp 30 can also be known in advance (by calculations or from technical data of the wire manufacturer). For the case of an increase in the leakage conductance, the desired characteristics are calculated on the basis of the same equations (1) and (2).

Figure 7:
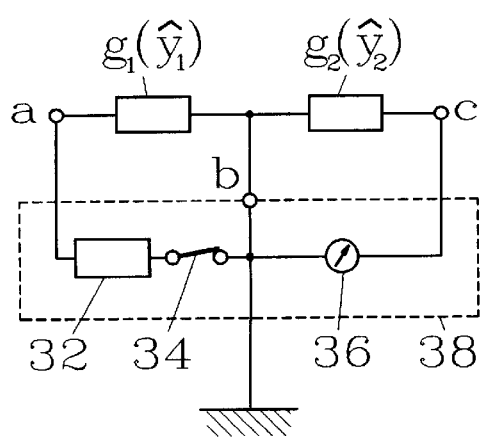
FIG. 7 is a schematic view of an apparatus of the invention for monitoring the insulation condition of the electric system by incorporating a reference electric element between one of the wires of the system and the conductive body.

If leakage conductances of separate portions of the electric system cannot be calculated, and the system dictates that the condition of the electric insulation should be monitored by observing the electric system as a whole, (i.e., when it is required that the insulation conditions be monitored by observing the resulting leakage conductance or resistance), the system may be equipped with a current leakage-control element. FIG. 7 is a simplified diagram of the monitoring system of the invention which incorporates a current leakage control element in the form of a reference resistor 32. This reference resistor is connected between one of the terminals (terminal "a" in FIG. 7) of generator 20 and conductive base 28 via a switch 34.

If leakage conductance of reference resistor 32 is designated $g_0$, the equations for calculation of $g_1$ and $g_2$ can be written as follows:

$$\text{first measurement: } U_1/U_2 = g_2/g_1 \qquad (3a)$$

$$\text{second measurement: } U'_1/U'_2 = g_2/(g_1+g_0) \qquad (3b),$$

where $U_1$ and $U_2$ are voltages measured on portions a–b and b–c of the equivalent circuit shown in FIG. 4A with switch 34 in an open (OFF) position. $U'_1$ and $U'_2$ are the same voltages with switch 34 in a closed (ON) position. Resulting leakage conductances $g_1$ and $g_2$ of the entire electric system are calculated from aforementioned equations (3) via $g_0$ and the voltage ratios:

$$g_1 = \frac{g_0}{(U_1/U_2)\cdot(U'_2/U'_1)-1} \qquad (3c)$$

$$= \frac{g_0}{\{(U-U_2)/U_2 \cdot [U'_2/(U-U'_2)]\}-1}$$

$$= \frac{g_0}{\{U_1/(U-U_1)\cdot[(U-U'_1)/U'_1]\}-1};$$

$$g_2 = \frac{g_0}{(U'_2/U'_1)-(U_2/U_1)}$$

$$= \frac{g_0}{U'_2/(U-U'_2)-U_2/(U-U_2)}$$

$$= \frac{g_0}{(U-U'_1)/U'_1-(U-U_1)/U_1}.$$

If reference resistor 32 is connected in the portion b–c of the diagram of FIG. 7 instead of the portion a–b, then equation (3b) will be replaced by the following equation (3d):

$$U'_1/U'_2 = (g_2+g_0)/g_1 \qquad (3d).$$

Then the formulae for leakage conductance will be expressed as follows:

$$g_1 = \frac{g_0}{(U'_1/U'_2)-(U_1/U_2)} \qquad (3e)$$

$$= \frac{g_0}{(U - U'_2)/U'_2 - (U - U_2)/U_2}$$

$$= \frac{g_0}{U'_1/(U - U'_1) - U_1/(U - U_1)};$$

$$g_2 = \frac{g_0}{\{(U'_1/U'_2)(U_2/U_1)\} - 1}$$

$$= \frac{g_0}{\{(U - U'_2)/U'_2 \cdot [U_2/(U - U_2)]\} - 1}$$

$$= \frac{g_0}{\{U'_1/(U - U'_1) \cdot [(U - U_1)/U_1]\} - 1}.$$

When reference resistor 32 is connected in the portion a–b, the leakage power of the entire system will be expressed as follows:

$$P = U \cdot U_1 \cdot g_1 \quad (3f)$$
$$= U \cdot U_2 \cdot g_2$$
$$= g_0 \frac{U_1 U'_1 (U - U_1)}{U_1 - U'_1}$$
$$= g_0 \frac{U_2 (U - U'_2)(U - U_2)}{U'_2 - U_2}.$$

In this case, the resulting leakage conductance of the entire system referenced to system voltage U will be the following:

$$g^* = P/U^2 \quad (3h)$$
$$= g_0/U^2 \frac{U_1 U'_1 (U - U_1)}{U_1 - U'_1}$$
$$= g_0/U^2 \frac{U_2 (U - U'_2)(U - U_2)}{U'_2 - U_2}.$$

In the case where voltages $U_1$ and $U_2$ are measured simultaneously, the leakage power of the aforementioned energized electric system can be calculated by the following formula:

$$P = g_0 \frac{U_2 \cdot U'_1 \cdot U_1}{U'_2 - U_2}$$

For the embodiment with the connection of reference resistor 32 into portion b–c, the leakage power of the system will be expressed as follows:

$$P = g_0 \frac{U_2 U'_2 (U - U_2)}{U_2 - U'_2} = g_0 \frac{U_1 (U - U'_1)(U - U_1)}{U'_1 - U_1}, \quad (3k)$$

and the resulting leakage conductance of the entire system referenced to system voltage U will be as follows:

$$g^* = P/U^2 \quad (3l)$$
$$= g_0/U^2 \frac{U_2 U'_2 (U - U_2)}{U_2 - U'_2}$$
$$= g_0/U^2 \frac{U_1 (U - U'_1)(U - U_1)}{U'_1 - U_1}.$$

Equations (3a to 3l) are common and basic to all embodiments of the present invention, since they utilize potential differences across unknown conductances. These equations are applicable for determining parameters of insulation in various embodiments of the present invention. For examples, equations (2a, 2b) are specific forms of equations (3a, 3d) where some of conductances are known in advance.

Generally, the method of the invention can be realized by using two voltmeters. If conductances of voltmeters themselves are too high and may influence the results of measurement, the voltmeters' conductances can be taken into consideration for calculations as known components of conductances of $g_1$ and $g_2$. The same principle can be used for taking into account the conductance of switch 34 in its OFF position.

If voltage U on the output terminals of generator 20 is stable, only one voltmeter, such as a voltmeter 36 in FIG. 7, is sufficient for measurement. This voltmeter shows voltage $U_2$, whereas voltage $U_1$ is calculated as a difference $U-U_2$. In order to obtain more accurate results, it is recommended to measure both $U_1$, U or $U_1$, $U_2$ simultaneously. Instead of connecting reference resistor 32 between of the generator terminal and conductive body 28, this resistor may be connected between one of the load terminals and conducive body 28. In this case, the same formulae (3a–3l) may be used for calculation, but voltages $U_3$, $U_4$ will be used instead of voltages $U_1$ and $U_2$, and the obtained conductances will be referenced to the load voltage. Block 38 shown in FIG. 7 by a broken line includes the least amount of elements required for realization of the invention, i.e., at least one voltmeter and at least one reference resistor with a switch.

Figure 8:
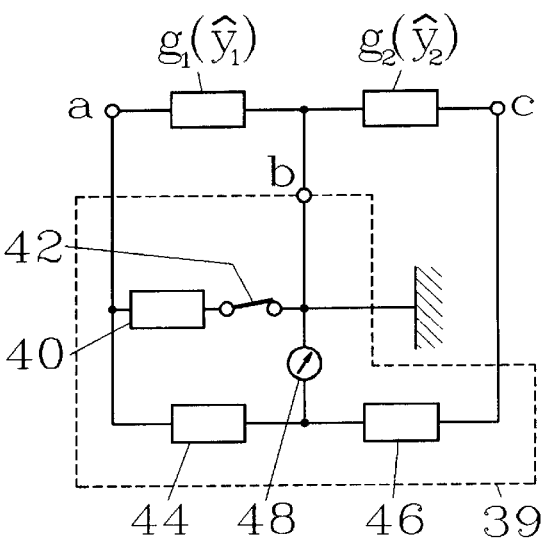
FIG. 8 is another embodiment of the apparatus of FIG. 7 with a different measurement circuit.

FIG. 8 illustrates another embodiment of the invention with reference resistor 40 similarly connected via switch 42 between one of the generator terminal and conductive body 28. This embodiment is advantageous in that it provides better accuracy of measurement. In FIG. 8, the monitoring circuit contains two identical resistors 44 and 46 which form a a voltage divider and divide voltage U into two halves U/2. A voltmeter 48 is connected between conductive body 28 and a point between resistors 44 and 46. If a reading on voltmeter 48 is designated $U_0$, the following equations may be written:

For the first measurement:

$$U_1 U/2 - U_0;\ U_2 = U/2 + U_0;\ U_0 = \tfrac{1}{2}(U_2 - U_1) \quad (4a)$$

For the second measurement:

$$U'_1 = U/2 - U'_0;\ U'_2 = U/2 + U'_0;\ U'_0 = \tfrac{1}{2}(U'_2 - U'_1) \quad (4b).$$

By substituting equations (4a, 4b) into equations (3f, 3h), one can obtain the following expressions for determining insulation parameters for an apparatus of FIG. 8 in terms of $U_0$, $U'_0$:

Leakage power of the entire electric system:

$$P = \frac{g_0}{8} \cdot \frac{(U^2 - 4U_0^2)(U - 2U'_0)}{(U'_0 - U_0)} \quad (4c)$$

Resulting leakage conductance of the system as a whole referenced to the system voltage U:

$$g^* = P/U^2 = \frac{g_0}{8U^2} \cdot \frac{(U^2 - 4U_0^2)(U - 2U'_0)}{(U'_0 - U_0)}. \quad (4d)$$

Thus, formulae (4a–4d) for the embodiment of FIG. 8 can be considered as a specific case of formulae (3a–3l), when voltages on portions a–b and b–c (FIGS. 7 and 8) are measured not directly but indirectly via voltage $U_0$.

Block 39 shown in FIG. 8 by the broken line includes the least amount of elements required for realization of the embodiment of FIG. 8, i.e., at least one voltmeter, one voltage divider, and at least one reference resistor with a switch.

Figure 4B:
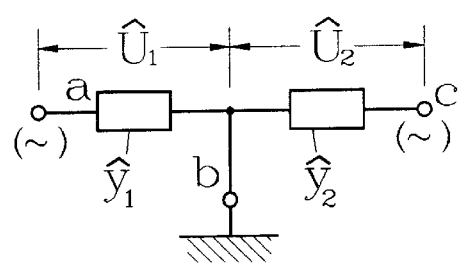
FIG. 4B is an electrical model simulating total current leakage conditions in the system of FIG. 1 for the case of alternative current.

FIG. 4B is an equivalent circuit simulating total current leakage conditions in the system of FIG. 1 for the case of alternative current (AC). In this case, active leakage conductances "g" and "G" are substituted by leakage admittances "ŷ" and "Ŷ", where designation "^" means a complex number or a vector representation, Ŷ designates admittances calculated in design, and ŷ designates real admittances.

Figure 9:
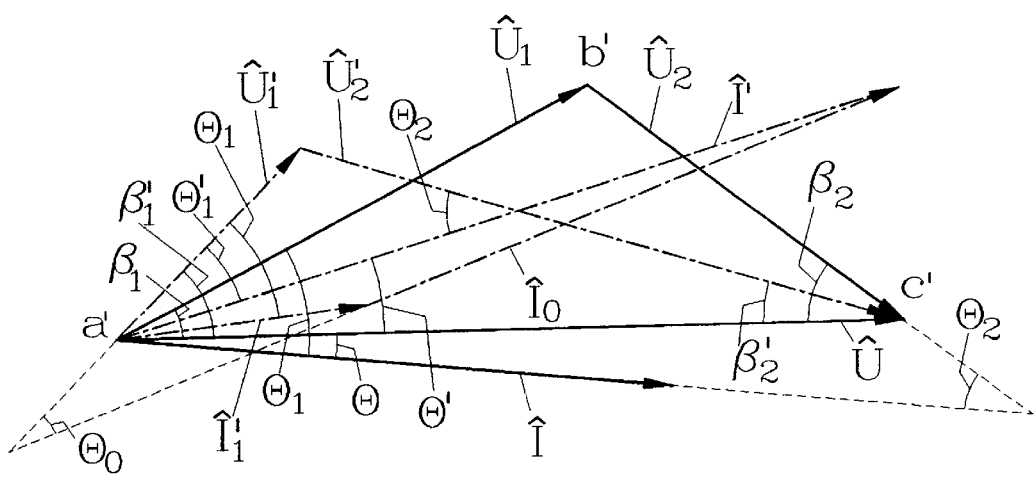
FIG. 9 is a phasor diagram illustrating the principle of the invention in case of monitoring insulation conditions in an AC system.

FIG. 9 is a phasor diagram illustrating the principle of the invention in case of monitoring insulation conditions in an AC system. A phasor is a vector representation of sinusoidally varying current or voltage. In this diagram, points a', b', and c' correspond to points "a","b", and "c". Angles formed in a counterclockwise direction are considered positive, and angles formed in the opposite direction are considered negative. More specifically, a phasor $\hat{U}_1=\hat{U}_{ab}$ leads a generator voltage $\hat{U}_{ac}=\hat{U}$ by a positive angle $\beta_1$, whereas a phasor $\hat{U}_2=\hat{U}_{bc}$ lags a generator voltage $\hat{U}$ by a negative angle $\beta_2$.

Measurement of all three voltages $\hat{U}_1, \hat{U}_2$, and $\hat{U}$ allows formation of a voltage triangle a'b'c' shown in FIG. 9, and hence to determine angles $\beta_1$ and $\beta_2$.

As the same leakage current flows along both portions a–b and b–c of the model circuit of FIG. 4B, voltage phasors $\hat{U}_1$, $\hat{U}_2$ and $\hat{U}$ are proportional to respective leakage impedances $\hat{Z}_1$, $\hat{Z}_2$, and $\hat{Z}$:

$$\hat{Z}_1=1/\hat{Y}_1; \hat{Z}_2=1/\hat{Y}_2; \text{ and } \hat{Z}=1/\hat{Y},$$

Where impedances $\hat{Z}_1$, $\hat{Z}_2$, $\hat{Z}$, admittances $\hat{Y}_1$, $\hat{Y}_2$ and voltages $\hat{U}_1$, $\hat{U}_2$, and $\hat{U}$ are the following complex numbers:

$$\hat{Z}_1=Z_1 e^{J\theta_1}, \hat{Z}_2=Z_2 e^{-J\theta_2}, \hat{Z}=Ze^{J\theta},$$

$$\hat{Y}_1=Y_1 e^{-J\theta_1}, \hat{Y}_2=Y_2 e^{J\theta_2}, \hat{Y}=Ye^{-J\theta},$$

$$\hat{U}_1=U_1 e^{J\theta_1}, \hat{U}_2=U_2 e^{-J\theta_2}, \hat{U}=Ue^{J\theta}, \quad (5a)$$

where $\theta_1, \theta_2$, and $\theta$ are angles between directions of phasors of voltages $\hat{U}_1$, $\hat{U}_2$, $\hat{U}$, and resulting leakage current $\hat{I}$. According to the definition given above, angles $\theta_1$ and $\theta$ are considered positive, and angle $\theta_2$ is negative. The resulting current line coincides with the real axis and is used as a reference for calculating angles $\theta$.

The equations derived above for direct current systems can be applied to alternative current systems if conductances are replaced by complex admittances and voltages are expressed by complex numbers (compare FIG. 4A with FIG. 4B where admittances Ŷ are used instead of conductances G). FIGS. 7 and 8 described above are applicable to both DC and AC systems (the AC designations are given in parentheses).

Since a triangle formed by impedances $Z_1$, $Z_2$, $Z_3$ is geometrically similar to a triangle a'b'c' (FIG. 9) formed by voltages $\hat{U}_1$, $\hat{U}_2$, $\hat{U}$, the respective angles of both triangles are equal to each other. This similarity, which is expressed by formulae (5a), allows substituting equation $\hat{U}_2/\hat{U}_1=\hat{Z}_2/\hat{Z}_1$ of complex numbers by the following ratios of their magnitudes:

$$U_2/U_1=Z_2/Z_1=Y_1/Y_2 \quad (5b),$$

where voltage magnitudes can be measured by voltmeters.

If an embodiment of FIG. 7 is used for an AC electric system, a reference admittance 32 should be introduced into portion a–b. Reference admittance 32 is equal to $\hat{Y}_0=Y_0 e^{-j\theta_0}$, where $\theta_0$ is an angle between current and voltage for reference admittance 32. When switch 34 is in ON position, the admittance $\hat{Y}'_1$ of portion a–b is equal to the following:

$$\hat{Y}'_1=\hat{Y}_1+\hat{Y}_0=Y_1 e^{-J\theta_1}+y_0 e^{-J\theta_0} (\theta_1>0, \theta_0>0) \quad (5c),$$

and voltages are equal to the following:

$$\hat{U}_1=U'_1 e^{J\theta'_1}, \hat{U}'_2=U'_2 e^{-J\theta_2}, \hat{U}=Ue^{-J\theta'} \quad (5d),$$

where $\theta'_1$, and $\theta'$ are angles between resulting current $\hat{I}'$ and voltages $\hat{U}'_1$ and $\hat{U}$, respectively. The resulting leakage current $\hat{I}'$ is equal to $$\hat{I}'=\hat{I}'_1+\hat{I}_0 \quad (5e),$$

where $\hat{I}_1$ and $\hat{I}_0$ are currents via admittances $\hat{Y}_1$ and $\hat{Y}_0$, respectively. All aforementioned voltages, currents, and angles are shown in FIG. 9, where solid lines corresponds to the voltages and currents for an OFF position of switch 34, and broken dash-and-dot lines correspond to the ON position of the switch.

The following expression can be written for the second measurement, when switch 34 is in the ON position:

$$\hat{U}'_2/\hat{U}'_1 = \hat{Y}'_1/\hat{Y}'_2 \quad (5f)$$

or $$U'_2/U'_1 \cdot e^{-J(\theta'_1+\theta_2)} = \frac{1}{Y_2 e^{J\theta_2}}(Y_1 e^{-J\theta_1}+Y_0 e^{-J\theta_0})$$

or $$U'_2/U'_1 = 1/Y_2 \cdot (Y_1 \cdot e^{-J(\theta_1-\theta'_1)}+Y_0 \cdot e^{J(\theta'_1-\theta_0)}).$$

Since the triangle of admittances is geometrically similar to the triangle of currents having two angles equal to $(\theta'_1-\theta_0)$, and $(\theta_1-\theta'_1)$, the expression, which in equation (5f) is in parenthesis, is equal to the magnitude of resulting admittances $Y'_1$ of portion a–b.

Thus the following can be written:

$$U'_2/U'_1=Y'_1/Y_2 \cdot [Y_1 \cos(\theta_1-\theta'_1)+Y_0 \cos(\theta'_1-\theta_0)] \quad (5g).$$

If the following designations are made:

$$M=\cos(\theta_1-\theta'_1)=\cos(\beta_1+\beta_2-\beta'_1-\beta'_2)$$

$$N=\cos(\theta'_1-\theta_0)=\cos(\beta_1-\beta_2+\beta'_1-\beta'_2), \quad (5h)$$

where $\beta'_1$, $\beta'_2$ are angles between voltage $\hat{U}$ of the electric system and voltages $\hat{U}'_1$ and $\hat{U}'_2$, respectively. In this case, equation (5g) can be rewritten as follows:

$$U'_2/U'_1=1/Y_2 \cdot (M \cdot Y_1+N \cdot Y_0) \quad (5i).$$

Based on the above, the solution of equations (5b) and (5i) can be presented in the following form:

$$Y_1 = Y_0 \frac{N}{(U_1/U_2)(U'_2/U'_1)-M}; \quad (5j)$$

$$Y_2 = Y_0 \frac{N}{(U'_2/U'_1)-M(U_2/U_1)};$$

Full leakage power of the system will be expressed as follows:

$$S = U \cdot U_1 \cdot Y_1 = \frac{U \cdot U_1 \cdot U_2 \cdot U_1' \cdot N \cdot Y_0}{U_1 \cdot U_2' - U_1' \cdot U_2 \cdot M} \quad (5k)$$

The resulting leakage admittance of the entire electric system referred to the system voltage U will be presented by the following formula:

$$Y^* = P/U^2 = \frac{U_1 \cdot U_2 \cdot U_1' \cdot N \cdot Y_0}{U_1 \cdot (U_1 \cdot U_2' - U_1' \cdot U_2 \cdot M)} \quad (5l)$$

Thus, in order to calculate leakage parameters of an AC system, it is necessary to measure merely voltages. In other words, if the system voltage U is constant, it would be sufficient to simultaneously measure two voltages $U_1$, $U_2$ for the first measurement and $U'_1$, $U'_2$ for the second measurement. If voltage U is unstable, three voltages U, $U_1$, $U_2$ should be simultaneously measured for the first measurement and three voltages $U, U'_1, U'_2$ should be simultaneously measured for the second measurement.

In the AC system, reference element 32 (FIG. 7) or 40 (FIG. 8) may be a resistor or an element characterized by an impedance. The type of this element (capacitive or inductive) depends on the nature of expected leakage admittances $\hat{y}_1$ and $\hat{y}_2$, as well as on the desired measurement accuracy. The monitoring system may contain two reference elements one of which may be used in the first measurement as an active-inductive element for connection in parallel to admittance $\hat{y}_1$ and the other element may be used as an active-capacitive for connection in parallel to admittance $\hat{y}_2$. During the second measurement, the active-inductive element is connected in parallel to $\hat{y}_2$, while the active-capacitive element is connected in parallel to $\hat{y}_1$, i.e., the reference elements change places. This improves measurement accuracy.

Calculation formulae for implementation of two reference elements may be obtained in a similar manner by solving a system of the following two equations:

$$\frac{U_2}{U_1} = \frac{Y_1 + Y_0''}{Y_2 + Y_0'''};$$

$$\frac{U_2'}{U_1'} = \frac{Y_1 + Y_0'''}{Y_2 + Y_0''},$$

where $Y''_0$ is an active-inductive reference admittance, and
$Y'''_0$ is an active-capacitive reference admittance.

Any AC multi-phase system may be presented as a linear combination of single-phase systems and be considered with the application of superposition principles. This means that the present invention is applicable to both AC and DC electric systems of any type.

The formulae for calculation of insulation parameters for both AC and DC electric systems can be generalized in the following form:

Leakage admittances of both portions a–b and b–c:

$$C_1 = C_0 \frac{N}{(U_1/U_2) \cdot (U_2'/U_1') - M} \quad (6a)$$

$$C_2 = C_0 \frac{N}{(U_2'/U_1') - M(U_2/U_1)}$$

where $C_1$, $C_2$ are $Y_1$, $Y_2$, for an AC system and $g_1$, $g_2$ for a DC system, respectively.

Full leakage power:

$$W = \frac{U \cdot U_1 \cdot U_2 \cdot U_1' \cdot N \cdot C_o}{U_1 \cdot U_2' - U_1' \cdot U_2 \cdot M} \quad (6b)$$

The resulting leakage admittance of the entire electric system referred to the system voltage U:

$$C^* = \frac{U_1 \cdot U_2 \cdot U_1' \cdot N \cdot C_o}{U \cdot (U_1 \cdot U_2' - U_1' \cdot U_2 \cdot M)}, \quad (6c)$$

where $C_0$ is a known value which, in the case of a DC electric system, is reference conductance $g_0$ and, in the case of an AC system, is reference admittance $Y_0$. For a DC system, M and N are equal to 1 (M=N=1) and for an AC system they are equal to a value calculated in accordance with equations (5h). Power W is a full power S for an AC system and active power P for a DC system; $C^*$ is $Y^*$ for an AC system and $g^*$ for a DC system.

In order to reveal the dynamics in variations of the insulation parameters and to exclude random measurement errors, the aforementioned measurement procedure should be periodically repeated with a given periodicity.

The present invention is applicable for the entire system as a whole or to any part thereof. For example, even though load 22 (FIG. 1) is disconnected, leakage currents $I_P$ and $I_N$ will still exist, as well as leakage currents inside generator 20. Therefore the aforementioned method of the invention for determining parameters of current leakage is applicable for a system without a load. In this case, the following values should be used in all equations given above: $g_L$ ($G_L$)=0 or $\hat{y}_L$ ($\hat{Y}_L$)=0, and $\phi_3=\phi_1, \phi_4, =\phi_2$. In addition, if transmission lines 24 and 26 are absent as well and the system includes only generator 20 with its winding 20a, the method and the system of the invention are still applicable for monitoring leakage currents of the generator. The following formulae should be used for this case:

$g_{T1}=G_{T2}=0; U_1/U_2=g_{G2}/g_{G1}$ (for DC system)

or $\hat{y}_{T1}=\hat{y}_{T2}=0; \hat{U}_1/\hat{U}_2=\hat{y}_{G2}/\hat{y}_{G1}$ (for AC system)

Thus, the invention is applicable to any energized part of an electric system.

Since electric systems are normally characterized by rated leakage resistances, these resistances can be calculated as values inverse to calculated leakage conductances (admittances) $g^*$ ($y^*$) as $R=1/g^*$ or $Z=1/\hat{y}^*$.

The operation conditions of a specific electric system are a major factor which is taken into consideration when deciding which of the insulation parameters has a priority. The value of this parameter, which is critical for insulation functioning or for safety reasons, is set at a design stage. For evaluation of the performance characteristic of the electric insulation or for generation of an alarm signal, the measured parameters are compared with this critical value.

Figure 10:
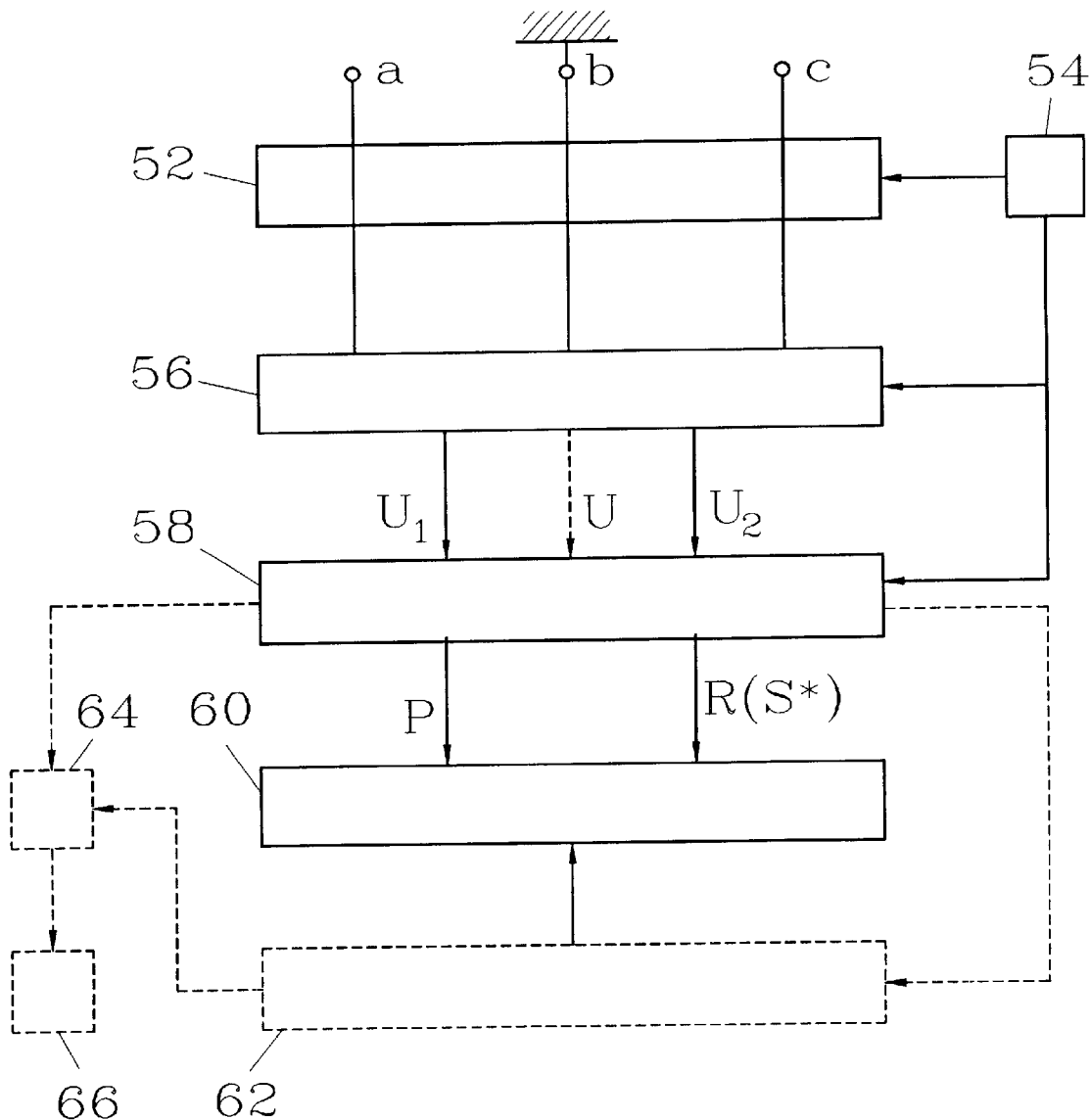
FIG. 10 is a generalized block diagram of the entire insulation monitoring system of the invention.

The monitoring systems of the invention have been described with reference to separate embodiments (FIGS. 7 and 8) illustrating different methods of measurement. FIG. 10 is a generalized complete block diagram of the entire insulation monitoring system of the invention illustrating interconnection between individual units of the monitoring system.

In FIG. 10, points "a","b", and "c" corresponds to the same points in the diagrams of FIGS. 4A and 4B. The monitoring system comprises:

an insulation parameter change unit 52 (which may be, e.g., a mere mechanical device for raising a wire or its part above conductive body 28 or conductive wire clamping device, or an electrical device such as elements 32 and 40 in FIGS. 7 and 8);

a programmable timer 54 which sets a periodicity and a program for measurements and calculations (e.g., 2 sec for each 3 min; the programmable timers are well known commercially produced devices);

a voltage measurement unit 56 which presents results of measurement in a digital form (e.g., digital voltmeters);

a programmable calculation device 58 which receives results of measurements from voltage measurement unit 56 and commands from programmable timer 54 for calculating insulation leakage parameters by solving equations (2), (3), (4) (a programmable calculator device may be a conventional programmable calculator commercially produced, e.g., by Calculated Industries, Inc., Yorba Linda, Calif.);

a display unit or a data recorder 60 which receives information from programmable calculation device 58 for displaying, or recording the results of calculations;

a prognosis unit 62 which extrapolates the results of the calculations received from programmable calculation device 58 and is connected to a display unit for displaying the results of extrapolation. Prognosis unit 62 and its connections are shown by broken lines, since the use of this device is optional;

a comparator unit 64 connected to the output of programmable calculation device 58 which compares the results of calculation with preset thresholds of insulation characteristics; and an alarm unit 66 which generates an alarm signal and receives commands from comparator 64; prognosis unit 62 may be connected to comparator 64.

The monitoring system shown in FIG. 10 operates as follows:

When first signal of programmable timer 54 is sent to voltage measurement unit 56 and to programmable calculation device 58, voltage measurement unit 56 measures voltages $U_1$ and $U_2$ (or one of them and system voltage U). For AC all three voltages should be measured. The results of measurements are sent in a digitized form to programmable calculation device 58 where the results of measurements are stored for future calculations. A second signal from programmable timer 54 activates insulation parameter change unit 52, e.g., by switching on switch 34 (FIG. 7) or switch 42 (FIG. 8). At the same time a signal is sent to voltage measurement unit and to programmable calculation device 58, and the cycles of measurement and storing of the measurement results is repeated. A third signal of timer 54 gives a command to programmable calculation device 58 for calculating insulation parameters by means of aforementioned formulae on the basis of both measurement results. At the same time, a signal is sent to de-energize or disengage insulation parameter change unit 52, e.g., by turning switch 34 (FIG. 7) or switch 42 (FIG. 8) into OFF position. The results of calculations in terms of leakage power P and/or leakage resistance R (leakage conductance g*) are displayed by display unit or a data recorder 60 and are compared in comparator unit 64 with preset threshold values.

The above-described measurement-calculation-comparison cycle is repeated, e.g., until the results of calculation becomes equal to or exceed the preset threshold values. When this happens, comparator unit 64 sends a command to alarm unit 66 which generates an alarm signal. If necessary, comparator unit 64 receives signals from prognosis unit 62 to compare the aforementioned threshold values with the extrapolated prognosis data.

Thus it has been shown that the invention is based on two voltage measurements in one of which the operating conditions of the electric insulation are artificially changed for a known value. Insulation parameters are then calculated by a set of formulas using the results of the two measurements. In the context of the present invention, the words "changing at least one of parameters of electric insulation" in the energized electric system means changing the resulting leakage current of the entire electric system.

It has been shown that the invention provides an apparatus and method for monitoring insulation resistance conditions in energized electric systems which do not need de-energization of the electric system for its control or monitoring, ensure accuracy in evaluating the results of the aforementioned control and monitoring, exclude modernization or redesigning of the system to be controlled for incorporating measuring and monitoring elements, and is suitable for controlling insulation in multiple-component electric systems. It has been shown that, in contrast to the methods of measurement under "cold" conditions, the method of the invention takes into consideration the effect of factors which occur only under real operating conditions, e.g., real distribution of voltages in the electric system during its operation. It has been also shown that the invention provides an insulation monitoring system of the aforementioned type which is simple in structure, inexpensive to manufacture, reliable in operation, and simple to control.

Although the invention has been shown in the form of specific embodiments, it is understood that these embodiments were given only as examples and that any changes and modifications are possible, provided they do not depart from the scope of the appended claims. For example, some parts of electric systems may be located on a nonconductive supports. The monitoring system may have measurement and insulation parameter change units having connections to the electric system different from those shown in FIGS. 7 and 8. For example, measurement device 36 (FIG. 7) may be connected across points "a" and "b" instead of points "b" and "c". The reference element may not only to be connected to or disconnected from one of shoulders "ab" or "bc", but can also be selectively switched between these shoulder. A combination of several reference elements, e.g., star-connected resistors, may be used instead of individual elements. Position of wires with respect to the conductive base may be changed not only by raising one of the wires but other raising one of the wires and lowering the other wire. An increase of the insulation leakage may be achieved by devices other than the one shown in FIG. 6.

What we claim is:

1. A method for monitoring parameters of electric insulation in an energized electric system comprising at least, a conductive base, a first insulated wire and a second insulated wire with a voltage between them, said first insulated wire having a conducting part and an insulating part which insulates said first insulated wire from said conductive base, said second insulated wire having a conductive part and an insulating part which insulates said second insulated wire from said conductive base, a first detectable potential difference existing between said conductive base and said conductive part of said first insulated wire, and a second detectable potential difference existing between said conductive base and said conductive part of said second insulated wire, said potential differences being caused by current leakages from said conducting parts of said first insulated wire and said second insulated wire to said conductive base through said insulating parts of said first insulated wire and said second insulated wire, said energized electric system having a resulting leakage power and a resulting leakage admittance, said method comprising the steps of:

measuring by means of a measuring system at least one of said detectable potential differences at a first moment of time for obtaining first results of measurement;

changing at least one of said detectable potential differences by changing at least one of said parameters of electric insulation by a known value;

measuring by said measuring system at least one of said detectable potential differences at a second moment of time for obtaining second results of measurement; and determining said parameters of electric insulation on the basis of said known value and said first and second results of measurement for obtaining current values of said parameters of electric insulation.

2. The method of claim 1, wherein said all steps of claim 1 are repeated at least once.

3. The method of claim 2, wherein said all steps of claim 1 are repeated with a predetermined periodicity in order to reveal the dynamics in variations of the insulation parameters.

4. The method of claim 1, wherein said parameters of electric insulation are selected from the group consisting of:

a leakage admittance from said conducting part of said first insulated wire to said conductive base;

a leakage admittance from said conducting part of said second insulated wire to said conductive base;

said resulting leakage admittance of said energized electric system; and said resulting leakage power of said energized electric system.

5. The method of claim 4, wherein said energized electric system is a direct current system and wherein said changing at least one of said parameters of electric insulation by a known value is changing a leakage conductance from said conductive part of at least one of said insulated wires to said conductive base by means of reference conductance.

6. The method of claim 5, wherein said leakage conductance from said conductive part of at least one of said insulated wires to said conductive base is calculated by the following formula:

$$g_1 = \frac{g_0}{\{U_1/(U-U_1)\cdot[(U-U'_1)/U'_1]\}-1},$$

where:

$g_1$ is leakage conductance to said conductive base from said first insulated wire having the leakage conductance changed by said known value;

$g_0$ is said known value;

$U_1$ is said first detectable potential difference measured at said first moment of time;

$U'_1$ is said first detectable potential difference measured at said second moment of time;

U is said voltage between said first insulated wire and said second insulated wire.

7. The method of claim 5, wherein leakage conductance from said conductive part of at least one of said insulated wires to said conductive base is calculated by the following formula:

$$g_1 = \frac{g_0}{\{(U-U_2)/U_2 \cdot [U'_2/(U-U'_2)]\}-1},$$

where:

$g_1$ is leakage conductance to said conductive base from said conductive part of said first insulated wire having leakage conductance changed by said known value;

$g_0$ is said known value;

$U_2$ is said second detectable potential difference measured at said first moment of time;

$U'_2$ is said second detectable potential difference measured at said second moment of time;

U is said voltage between said first insulated wire and said second insulated wire.

8. The method of claim 5, wherein leakage conductance from said conductive part of said second insulated wire to said conductive base is calculated by the following formula:

$$g_2 = \frac{g_0}{(U-U'_1)/U'_1 - (U-U_1)/U_1},$$

where:

$g_2$ is leakage conductance to said conductive base from said conductive part of said second insulated wire the leakage conductance of which remained unchanged;

$g_0$ is said known value;

$U_1$ is said first detectable potential difference measured at said first moment of time;

$U'_1$ is said first detectable potential difference measured at said second moment of time;

U is said voltage between said conductive part of said first insulated wire and said conductive part of said second insulated wire.

9. The method of claim 5, wherein leakage conductance from said conductive part of said second insulated wire to said conductive base is calculated by the following formula:

$$g_2 = \frac{g_0}{U'_2/(U-U'_2) - U_2/(U-U_2)},$$

where:

$g_2$ is leakage conductance to said conductive base from said conductive part of said second insulated wire the leakage conductance of which remained unchanged;

$g_0$ is said known value;

$U_2$ is said second detectable potential difference measured at said first moment of time;

$U'_2$ is said second detectable potential difference measured at said second moment of time;

U is said voltage between said first insulated wire and said second insulated wire.

10. The method of claim 5, wherein leakage conductance from said conductive part of at least one of said insulated wires to said conductive base is calculated by means of at least one of the following formulae:

$$g_1 = \frac{g_0}{\{U_1/(U-U_1)\cdot(U-U_1')/U_1'\}-1},$$

$$g_1 = \frac{g_0}{\{(U-U_2)/U_2 \cdot U_2'/(U-U_2')\}-1},$$

where:
- $g_1$ is leakage conductance to said conductive base from said first insulated wire the leakage conductance of which was changed by said known value;
- $g_0$ is said known value;
- $U_1$ is said first detectable potential difference measured at said first moment of time;
- $U'_1$ is said first detectable potential difference measured at said second moment of time;
- U is said voltage between said conductive part of said first insulated wire and said conductive part of said second insulated wire;
- $U_2$ is said second detectable potential difference measured at said first moment of time; and
- $U'_2$ is said second detectable potential difference measured at said second moment of time.

11. The method of claim 10, wherein said all steps of claim 1 are repeated at least once.

12. The method of claim 5, wherein leakage conductance from said conductive part of said second insulated wire to said conductive base is calculated by means of at least one of the following formulae:

$$g_2 = \frac{g_0}{(U-U_1')/U_1' - (U-U_1)/U_1},$$

$$g_2 = \frac{g_0}{U_2'/(U-U_2') - U_2/(U-U_2)},$$

where:
- $g_2$ is leakage conductance to said conductive base from said second insulated wire the leakage conductance of which remained unchanged;
- $g_0$ is said known value;
- $U_1$ is said first detectable potential difference measured at said first moment of time;
- $U'_1$ is said first detectable potential difference measured at said second moment of time;
- $U_2$ is said second detectable potential difference measured at said first moment of time; and
- $U'_2$ is said second detectable potential difference measured at said second moment of time;
- U is said voltage between said conductive part of said first insulated wire and said conductive part of said second insulated wire.

13. The method of claim 12, wherein said all steps of claim 1 are repeated at least once.

14. The method of claim 5, wherein said resulting leakage power of said energized electric system is calculated by the following formula:

$$P = g_0 \frac{U_1 U_1'(U-U_1)}{U_1 - U_1'},$$

where:
- P is said resulting leakage power;
- $g_0$ is said known value;
- $U_1$ is said first detectable potential difference measured at said first moment of time;
- $U'_1$ is said first detectable potential difference measured at said second moment of time;
- U is said voltage between said first insulated wire and said second insulated wire.

15. The method of claim 5, wherein said resulting leakage power of said energized electric system is calculated by the following formula:

$$P = g_0 \frac{U_2(U-U_2')(U-U_2)}{U_2' - U_2},$$

where:
- P is said resulting leakage power;
- $g_0$ is said known value;
- $U_2$ is said second detectable potential difference measured at said first moment of time;
- $U'_2$ is said second detectable potential difference measured at said second moment of time; and
- U is said voltage between said first insulated wire and said second insulated wire.

16. The method of claim 15, wherein said all steps of claim 1 are repeated at least once.

17. The method of claim 5, wherein said resulting leakage power is calculated by means of at least one of the following formulae:

$$P = g_0 \frac{U_1 U_1'(U-U_1)}{U_1 - U_1'},$$

$$P = g_0 \frac{U_2(U-U_2')(U-U_2)}{U_2' - U_2},$$

where:
- P is said resulting leakage power;
- $g_0$ is said known value;
- $U_1$ is said first detectable potential difference measured at said first moment of time;
- $U'_1$ is said first detectable potential difference measured at said second moment of time;
- $U_2$ is said second detectable potential difference measured at said first moment of time;
- $U'_2$ is said second detectable potential difference measured at said second moment of time; and
- U is said voltage between said first insulated wire and said second insulated wire.

18. The method of claim 17, wherein said all steps of claim 1 are repeated at least once.

19. The method of claim 5, wherein said resulting leakage conductance is calculated by means of the following formula:

$$g^* = g_0/U^2 \frac{U_1 \cdot U_1'(U-U_1)}{U_1 - U_1'},$$

where:
- $g^*$ is said resulting leakage conductance;
- $g_0$ is said known value;
- $U_1$ is said first detectable potential difference measured at said first moment of time;
- $U'_1$ is said first detectable potential difference measured at said second moment of time; and U is said voltage between said first insulated wire and said second insulated wire.

20. The method of claim 19, wherein said all steps of claim 1 are repeated at least once.

21. The method of claim 5, wherein said resulting leakage conductance of said energized electric system is calculated by means of the following formula:

$$g^* = g_0/U^2 \frac{U_2 \cdot (U - U'_2)(U - U_2)}{U'_2 - U_2},$$

where:

$g^*$ is said resulting leakage conductance;

$g_0$ is said known value;

$U_2$ is said second detectable potential difference measured at said first moment of time;

$U'_2$ is said second detectable potential difference measured at said second moment of time; and U is said voltage between said first insulated wire and said second insulated wire.

22. The method of claim 21, wherein said all steps of claim 1 are repeated at least once.

23. The method of claim 5, wherein said resulting leakage conductance of said energized electric system is calculated by means of at least one of the following formulae:

$$g^* = g_0/U^2 \frac{U_1 \cdot U'_1 (U - U_1)}{U_1 - U'_1},$$

$$g^* = g_0/U^2 \frac{U_2 \cdot (U - U'_2)(U - U_2)}{U'_2 - U_2},$$

where:

$g^*$ is said resulting leakage conductance;

$g_0$ is said known value;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time; and U is said voltage between said first insulated wire and said second insulated wire.

24. The method of claim 23, wherein said all steps of claim 1 are repeated at least once.

25. The method of claim 4, wherein said energized electric system is an alternating current system, and wherein changing at least one of said parameters of electric insulation by said known value is changing said leakage admittance from said conducting part of at least one of said insulated wires to said conductive base by a reference admittance.

26. The method of claim 25, wherein said leakage admittance from said conducting part of said first insulated wire to said conductive base is calculated by means of the following formula:

$$Y_1 = Y_0 \frac{N}{(U_1/U_2) \cdot (U'_2/U'_1) - M},$$

where:

$Y_1$ is said leakage admittance from said conducting part of said first insulated wire, the leakage admittance of which was changed, to said conductive base;

$Y_0$ is said known value;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time, U is said voltage between said first insulated wire and said second insulated wire, where M is equal to cos $(\beta_1+\beta_2-\beta'_1-\beta'_2)$ and N is equal to cos$(\beta_1-\beta_2+\beta'_1-\beta'_2)$, where:

$\beta_1$ is an angle between voltages $U_1$ and U;

$\beta_2$ is an angle between voltages $U_2$ and U;

$\beta'_1$ is an angle between voltages $U'_1$ and U; and $\beta'_2$ is an angle between voltages $U'_2$ and U.

27. The method of claim 25, wherein a leakage admittance from said conducting part of the other of said insulated wires to said conductive base is calculated by means of the following formula:

$$Y_2 = Y_0 \frac{N}{(U'_2/U'_1) - M(U_2/U_1)},$$

where:

$Y_2$ is said leakage admittance from said conducting part of the other of said insulated wires, the leakage admittance of which remained unchanged, to said conductive base;

$Y_0$ is said known value;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time, U is said voltage between said first insulated wire and said second insulated wire, M is equal to cos $(\beta_1+\beta_2-\beta'_1-\beta'_2)$, and N is equal to cos $(\beta_1-\beta_2+\beta'_1-\beta'_2)$, where:

$\beta_1$ is an angle between voltages $U_1$ and U;

$\beta_2$ is an angle between voltages $U_2$ and U;

$\beta'_1$ is an angle between voltages $U'_1$ and U; and $\beta'_2$ is an angle between voltages $U'_2$ and U.

28. The method of claim 25, wherein leakage admittances from said conducting parts of said first insulated wire and said second insulated wire, respectively, to said conductive base are calculated by means of the following formulae:

$$Y_1 = Y_0 \frac{N}{(U_1/U_2)\cdot(U_2'/U_1') - M},$$

$$Y_2 = Y_0 \frac{N}{(U_2'/U_1') - M(U_2/U_1)},$$

where:
- $Y_1$ is leakage admittance from said conducting part of said first insulated wire, the leakage admittance of which was changed, to said conductive base;
- $Y_2$ is leakage admittance from said conducting part of said second insulated wire, the leakage admittance of which remained unchanged, to said conductive base;
- $Y_0$ is said known value which is said reference admittance;
- $U_1$ is said first detectable potential difference measured at said first moment of time;
- $U'_1$ is said first detectable potential difference measured at said second moment of time;
- $U_2$ is said second detectable potential difference measured at said first moment of time;
- $U'_2$ is said second detectable potential difference measured at said second moment of time,
- U is said voltage between said first insulated wire and said second insulated wire,
- M is equal to $\cos(\beta_1+\beta_2-\beta'_1-\beta'_2)$, and
  N is equal to $\cos(\beta_1-\beta_2+\beta'_1-\beta'_2)$, where
- $\beta_1$ is an angle between voltages $U_1$ and U;
- $\beta_2$ is an angle between voltages $U_2$ and U;
- $\beta'_1$ is an angle between voltages $U'_1$ and U; and
- $\beta'_2$ is an angle between voltages $U'_2$ and U.

29. The method of claim 25, where said resulting leakage power is calculated by means of the following formula:

$$S = \frac{U \cdot U_1 \cdot U_2 \cdot U'_1 \cdot N \cdot Y_o}{U_1 \cdot U'_2 - U'_1 \cdot U_2 \cdot M},$$

where:
- S is said resulting leakage power;
- $Y_0$ is said known value;
- $U_1$ is said first detectable potential difference measured at said first moment of time;
- $U'_1$ is said first detectable potential difference measured at said second moment of time;
- $U_2$ is said second detectable potential difference measured at said first moment of time;
- $U'_2$ is said second detectable potential difference measured at said second moment of time,
- U is said voltage between said first insulated wire and said second insulated wire,
- M is equal to $\cos(\beta_1+\beta_2-\beta'_1-\beta'_2)$, and
  N is equal to $\cos(\beta_1-\beta_2+\beta'_1-\beta'_2)$, where:
- $\beta_1$ is an angle between voltages $U_1$ and U;
- $\beta_2$ is an angle between voltages $U_2$ and U;
- $\beta'_1$ is an angle between voltages $U'_1$ and U; and
- $\beta'_2$ is an angle between voltages $U'_2$ and U.

30. The method of claim 25, wherein the resulting leakage admittance $Y^*$ of said energized electric system referred to said voltage between said first insulated wire and said second insulated wire is expressed by the following formula:

$$Y^* = \frac{U_1 \cdot U_2 \cdot U'_1 \cdot N \cdot Y_o}{U \cdot (U_1 \cdot U'_2 - U'_1 \cdot U_2 \cdot M)},$$

where:
- $Y_0$ is said known value;
- $U_1$ is said first detectable potential difference measured at said first moment of time;
- $U'_1$ is said first detectable potential difference measured at said second moment of time;
- $U_2$ is said second detectable potential difference measured at said first moment of time;
- $U'_2$ is said second detectable potential difference measured at said second moment of time,
- U is said voltage between said first insulated wire and said second insulated wire,
- M is equal to $\cos(\beta_1+\beta_2-\beta'_1-\beta'_2)$, and
  N is equal to $\cos(\beta_1-\beta_2+\beta'_1-\beta'_2)$, where:
- $\beta_1$ is an angle between voltages $U_1$ and U;
- $\beta_2$ is an angle between voltages $U_2$ and U;
- $\beta'_1$ is an angle between voltages $U'_1$ and U; and
- $\beta'_2$ is an angle between voltages $U'_2$ and U.

31. The method of claim 1, wherein said energized electric system is selected from the group consisting of an alternating current system and a direct current system, and wherein changing at least one of said parameters of electric insulation is changing a leakage admittance from said conducting part of at least one of said insulated wires to said conductive base by reference admittances, said direct current system having leakage conductance.

32. The method of claim 31, wherein said admittance from said conducting part of said first insulated wire to said conductive base is calculated by means of the following formula:

$$C_1 = C_0 \frac{N}{(U_1/U_2)\cdot(U_2'/U_1') - M},$$

where:
- $C_1$ is said leakage admittance from said conducting part of said first insulated wire, the leakage admittance of which was changed by said known value, to said conductive base $C_0$ is said known value;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time;

U is said voltage between said first insulated wire and said second insulated wire;

M is equal to $$\cos(\beta_1+\beta_2-\beta'_1-\beta'_2)$$

and

N is equal to $$\cos(\beta_1-\beta_2+\beta'_1-\beta'_2),$$

where:

$\beta_1$ is an angle between voltages $U_1$ and U;

$\beta_2$ is an angle between voltages $U_2$ and U;

$\beta'_1$ is an angle between voltages $U'_1$ and U; and $\beta'_2$ is an angle between voltages $U'_2$ and U, wherein for said direct current system said angles $\beta_1, \beta_2, \beta'_1$, and $\beta'_2$ are equal to zero.

33. The method of claim 31, wherein a leakage admittance from said conducting part of said second insulated wire to said conductive base is calculated by means of the following formula:

$$C_2 = C_0 \frac{N}{U_1/U_2) \cdot (U'_2/U'_1) - M},$$

where:

$C_2$ is said leakage admittance from said conducting part of said second insulated wire, the leakage admittance of which remained unchanged, to said conductive base, for said direct current system said admittance $C_2$ being equal to said leakage conductance;

$C_0$ is said known value which is said reference admittance;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time, U is said voltage between said first insulated wire and said second insulated wire, M is equal to $$\cos(\beta_1+\beta_2-\beta'_1-\beta'_2)$$

and

N is equal to $$\cos(\beta_1-\beta_2+\beta'_1-\beta'_2),$$

where:

$\beta_1$ is an angle between voltages $U_1$ and U;

$\beta_2$ is an angle between voltages $U_2$ and U;

$\beta'_1$ is an angle between voltages $U'_1$ and U; and $\beta'_2$ is an angle between voltages $U'_2$ and U, wherein for said direct current system said angles $\beta_1, \beta_2, \beta'_1$, and $\beta'_2$ are equal to zero.

34. The method of claim 31, where said resulting leakage power is calculated by means of the following formula:

$$W = \frac{U \cdot U_1 \cdot U_2 \cdot U'_1 \cdot N \cdot C_0}{U_1 \cdot U'_2 - U'_1 \cdot U_2 \cdot M},$$

where:

W is said resulting leakage power;

$C_0$ is said known value;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time, U is said voltage between said first insulated wire and said second insulated wire, M is equal to $$\cos(\beta_1+\beta_2-\beta'_1-\beta'_2),$$

and

N is equal to $$\cos(\beta_1-\beta_2+\beta'_1\beta'_2),$$

where $\beta_1$ is an angle between voltages $U_1$ and U;

$\beta_2$ is an angle between voltages $U_2$ and U;

$\beta'_1$ is an angle between voltages $U'_1$ and U; and $\beta'_2$ is an angle between voltages $U'_2$ and U, wherein for said direct current system said angles $\beta_1, \beta_2, \beta'_1$, and $\beta'_2$ are equal to zero.

35. The method of claim 31, wherein a resulting leakage admittance of said energized electric system referred to said voltage between said first insulated wire and said second insulated wire is expressed by the following formula:

$$C^* = \frac{U_1 \cdot U_2 \cdot U'_1 \cdot N \cdot C_0}{U \cdot (U_1 \cdot U'_2 - U'_1 \cdot U_2 \cdot M)},$$

where:

$C^*$ is said resulting leakage admittance;

$C_0$ is said known value;

$U_1$ is said first detectable potential difference measured at said first moment of time;

$U'_1$ is said first detectable potential difference measured at said second moment of time;

$U_2$ is said second detectable potential difference measured at said first moment of time;

$U'_2$ is said second detectable potential difference measured at said second moment of time, U is said voltage between said first insulated wire and said second insulated wire, M is equal to $$\cos(\beta_1+\beta_2-\beta'_1-\beta'_2),$$

and

N is equal to $$\cos(\beta_1-\beta_2+\beta'_1-\beta'_2),$$

where:
- $\beta_1$ is an angle between voltages $U_1$ and U;
- $\beta_2$ is an angle between voltages $U_2$ and U;
- $\beta'_1$ is an angle between voltages $U'_1$ and U; and
- $\beta'_2$ is an angle between voltages $U'_2$ and U, wherein for said direct current system said angles $\beta_1$, $\beta_2$, $\beta'_1$, and $\beta'_2$ are equal to zero.

36. An apparatus for monitoring parameters of electric insulation in an energized electric system comprising at least, a conductive base, a first insulated wire and a second insulated wire with a voltage between them, said first insulated wire having a conducting part and an insulating part which insulates said first insulated wire from said conductive base, said second insulated wire having a conductive part and an insulating part which insulates said second insulated wire from said conductive base, a first detectable potential difference existing between said conductive base and said conductive part of said first insulated wire, and a second detectable potential difference existing between said conductive base and said conductive part of said second insulated wire, said potential differences being caused by current leakages from said conducting parts of said first insulated wire and said second insulated wire to said conductive base through said insulating parts of said first insulated wire and said second insulated wire, said energized electric system having a resulting leakage power and a resulting leakage admittance, said energized electric system may be selected from a group comprising an alternating current system and a direct current system, said apparatus comprising:
- means for measuring at least one of said detectable potential differences; and
- means for changing at least one of said parameters of electric insulation by a known value.

37. The apparatus of claim 36, wherein means for changing at least one of said parameters are mechanical means.

38. The apparatus of claim 37, wherein said mechanical means is a device for changing the position of at least a part of said at least one of said first insulated wire and said second insulated wire with respect to said conductive base.

39. The apparatus of claim 37, wherein said mechanical means is a device for embracing at least a part of said at least one of said first insulated wire and said second insulated wire with a conductive body.

40. The apparatus of claim 36, wherein said means for changing at least one of said parameters are electrical means.

41. The apparatus of claim 40, wherein said electrical means for changing at least one of said parameters of electric insulation by a known value is an electric circuit comprising an electrical reference element with at least one of electrical parameters being said known value and a switch for connecting said electrical reference element between said conductive base and one of said insulated wires.

42. The apparatus of claim 41, further comprising a voltage divider which is connected between said insulated wires, said voltage divider comprising at least a pair of electrical elements which are connected in series, a point of connection between said electrical elements being connected to said conductive base via said means for measuring at least one of said detectable potential differences.

43. The apparatus of claim 42, further comprising:
- means for setting periodicity of operation of said means for measuring at least one of said detectable potential differences; and
- a programmable calculation means for calculating said parameters of electric insulation, said programmable calculation means having display means and being connected to said means for measuring at least one of said detectable potential differences and to said means for setting periodicity.

44. The apparatus of claim 43, further comprising: threshold means having a preset value of at least one of said parameters of electric insulation and comparison means for comparing said calculated parameters of electric insulation with said preset value.

45. The apparatus of claim 44, further comprising alarm means for generating an alarm signal when at least one of said calculated parameters of electric insulation exceeds said preset value.

46. The apparatus of claim 45, further comprising prognosis means for extrapolating the results of the calculations by said programmable calculation means.

47. The apparatus of claim 43, wherein said programmable calculation means being programmed for calculating said parameters of electric insulation by at least one of the following formulae:

$$W = \frac{U \cdot U_1 \cdot U_2 \cdot U'_1 \cdot N \cdot C_0}{U_1 \cdot U'_2 - U'_1 \cdot U_2 \cdot M},$$

$$C^* = \frac{U_1 \cdot U_2 \cdot U'_1 \cdot N \cdot C_0}{U \cdot (U_1 \cdot U'_2 - U'_1 \cdot U_2 \cdot M)},$$

where:
- W is said resulting leakage power;
- $C^*$ is said resulting leakage admittance;
- $C_0$ is said known value which is said reference admittance;
- $U_1$ is said first detectable potential difference measured at said first moment of time;
- $U'_1$ is said first detectable potential difference measured at said second moment of time;
- $U_2$ is said second detectable potential difference measured at said first moment of time;
- $U'_2$ is said second detectable potential difference measured at said second moment of time,
- U is said voltage between said first insulated wire and said second insulated wire,
- M is equal to $$\cos(\beta_1+\beta_2-\beta'_1-\beta'_2),$$

and

N is equal to $$\cos(\beta_1-\beta_2+\beta'_1-\beta'_2),$$

where
- $\beta_1$ is an angle between voltages $U_1$ and U;
- $\beta_2$ is an angle between voltages $U_2$ and U;
- $\beta'_1$ is an angle between voltages $U'_1$ and U; and
- $\beta'_2$ is an angle between voltages $U'_2$ and U, wherein for said direct current system said angles $\beta_1$, $\beta_2$, $\beta'_1$, and $\beta'_2$ are equal to zero.

* * * * *